US006646294B2

United States Patent
Grimm

(10) Patent No.: US 6,646,294 B2
(45) Date of Patent: Nov. 11, 2003

(54) CIRCUIT CONFIGURATION WITH A PLURALITY OF TRANSISTORS OF TWO DIFFERENT CONDUCTIVITY TYPES

(75) Inventor: Wolfgang Grimm, Stockdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/170,290

(22) Filed: Jun. 13, 2002

(65) Prior Publication Data

US 2002/0190327 A1 Dec. 19, 2002

(30) Foreign Application Priority Data

Jun. 13, 2001  (DE) .......................................... 101 28 580

(51) Int. Cl.[7] ............................................. H01L 27/10
(52) U.S. Cl. ....................................... 257/206; 257/202
(58) Field of Search ................................. 257/202, 204, 257/206

(56) References Cited

U.S. PATENT DOCUMENTS

| 5,471,420 | A | * | 11/1995 | Nii et al. ..................... 365/182 |
| 5,780,883 | A | | 7/1998 | Tran et al. ................... 257/206 |
| 5,986,292 | A | | 11/1999 | Mizuno et al. .............. 257/202 |
| 6,483,131 | B1 | * | 11/2002 | Ko .............................. 257/204 |
| 2002/0040985 | A1 | * | 4/2002 | Aldrich ....................... 257/202 |

FOREIGN PATENT DOCUMENTS

| DE | 34 33 211 A1 | | 4/1985 | ........... H01L/27/10 |
| JP | 59 044 860 A | | 3/1984 | ........... H01L/27/04 |
| JP | 05343653 A | * | 12/1993 | ......... H01L/27/118 |

* cited by examiner

Primary Examiner—Allan R. Wilson
(74) Attorney, Agent, or Firm—Laurence A. Greenberg; Werner H. Stemer; Gregory L. Mayback

(57) ABSTRACT

The circuit configuration, in particular a logic or digital circuit, has transistors of different conductivity types. The transistors are disposed in spaced-apart rows. The transistor rows alternate with regard to the conductivity types. The transistors of the rows form groups. A group of the first conductivity type is associated with a group of the second conductivity type in an adjacent row and the associated groups together form a digital functional unit. A first, second, and third transistor row each contain transistor groups with an associated group in a downstream adjacent row (in a given direction) and transistor groups with an associated group in an upstream adjacent row. The second transistor row is formed between the first and third transistor rows and contains a transistor group that is associated with a group of the first row, and a transistor group that is associated with a group of the third row.

16 Claims, 6 Drawing Sheets

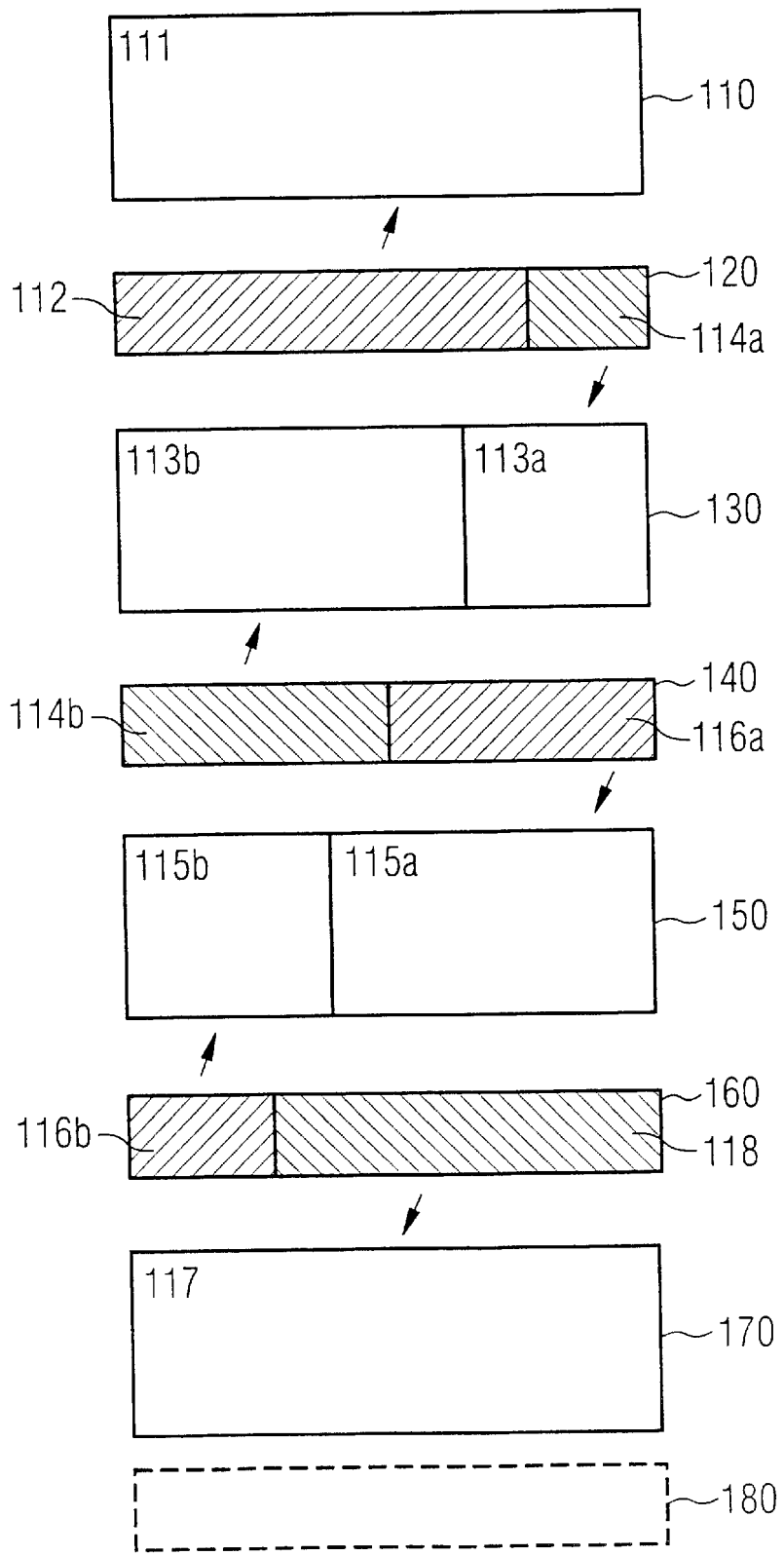

CIRCUIT CONFIGURATION WITH A PLURALITY OF TRANSISTORS OF TWO DIFFERENT CONDUCTIVITY TYPES

BACKGROUND OF THE INVENTION

Field of the Invention

The invention relates to a circuit configuration, particularly in a logic or digital circuit, having a plurality of transistors of two different conductivity types. The transistors are arranged in transistor rows, and the transistor rows are arranged at a distance from one another in succession along a direction of arrangement and alternately each contain only transistors of one of the two conductivity types. The transistors in each transistor row form groups such that a respective group of transistors of the first conductivity type has an associated group of transistors of the second conductivity type in an adjacent transistor row, the latter group forming a digital functional unit with this adjacent transistor row.

Such circuit configurations are obtained, by way of example, during automatic generation of "full custom layouts" using layout synthesis programs. These programs use, by way of example, circuit diagrams from cell libraries in order to make production of the layout for, by way of example, a logic or digital circuit automatable by using a limited number of basic building blocks. The individual transistors are thereby positioned and wired individually, in contrast to the "semi-custom" methodology, where the layouts for the library elements have already been firmly prescribed.

In CMOS technology, the N-channel transistors and the P-channel transistors are in this case positioned in separate rows and are connected to one another afterward. In this context, precisely one row of N-channel transistors and one row of P-channel transistors are respectively associated with one another. A group of N-channel transistors and a group of P-channel transistors in adjacent rows form a digital functional unit with one another, for example an inverter, a NOR gate, a NAND gate, a counter, a half-adder or the like.

Since the size and number of N-channel and P-channel transistors required are generally different in this case, empty areas are often obtained in individual rows. This is true particularly when different widths are used within a particular conductivity type.

Very wide transistors such as are often used, in particular, for P-channel transistors are also frequently split into a plurality of small transistors, which makes the numbers of N-channel and P-channel transistors even more different.

The empty areas described and the associated increased space requirement for the circuit configuration on the chip are naturally a drawback, given the scarce chip area, and need to be prevented as far as possible.

SUMMARY OF THE INVENTION

It is accordingly an object of the invention to provide a circuit configuration with a plurality of transistors of different conductivity types, which overcomes the above-mentioned disadvantages of the heretofore-known devices and methods of this general type and which has a lower space requirement for the same functionality.

With the foregoing and other objects in view there is provided, in accordance with the invention, a circuit configuration, comprising:

a plurality of transistors of a first and a second conductivity type disposed in transistor rows, the transistor rows being formed with a spacing distance from one another, disposed in succession along a given direction, and alternately containing only transistors of a respective one of the conductivity types;

the transistors in each transistor row forming groups such that a respective group of transistors of the first conductivity type has an associated group of transistors of the second conductivity type in an adjacent transistor row, the associated group of transistors forming a digital functional unit with the respective group in the adjacent the transistor row;

wherein a first transistor row, a second transistor row, and a third transistor row each contain both a transistor group whose associated transistor group is arranged in the transistor row that is adjacent in the given direction and a transistor group whose associated transistor group is arranged in the transistor row that is adjacent in an opposite direction; and wherein the second transistor row is arranged in the given direction between the first transistor row and the third transistor row and contains a transistor group that is associated with a transistor group in the first transistor row, and a transistor group that is associated with a transistor group in the third transistor row.

In other words, the invention is achieved in that a generic circuit configuration has at least one transistor row which contains both a transistor group whose associated transistor group is arranged in the transistor row which comes next in the direction of arrangement and a transistor group whose associated transistor group is arranged in the transistor row which comes previously in the direction of arrangement.

The invention is thus based on the concept of saving chip area overall by splitting the fixed row assignment of the functional units and by means of appropriate repositioning.

In accordance with a preferred embodiment with a particularly large gain in area, essentially all the transistor rows in the circuit configuration which contain transistors of the first conductivity type contain both a transistor group whose associated transistor group is arranged in the transistor row which comes next in the direction of arrangement and a transistor group whose associated transistor group is arranged in the transistor row which comes previously in the direction of arrangement.

In this case, the wording "essentially all the transistor rows" makes allowance for the fact that the edge rows have only one adjacent transistor row, that is to say cannot have groups associated both with the next row and with the previous row. Repositioning can also be ended if the maximum possible space gain for a particular arrangement has already been attained as a result of regroupings in previous transistor rows.

In another preferred embodiment, essentially all the transistor rows in the circuit configuration which contain transistors of the second conductivity type contain both a transistor group whose associated transistor group is arranged in the transistor row which comes next in the direction of arrangement and a transistor group whose associated transistor group is arranged in the transistor row which comes previously in the direction of arrangement.

It will be understood that the two embodiments can also be combined with one another.

In one particularly advantageous refinement of the invention, the at least one transistor row is split into two adjacent blocks such that the first block comprises only adjacent transistor groups whose associated transistor groups are arranged in the transistor row which comes next in the direction of arrangement, and the second block comprises only transistor groups whose associated transistor groups are arranged in the transistor row which comes previously in the direction of arrangement.

In the case of this area reduction concept, the affiliated transistor groups are pushed together to form larger blocks before they are repositioned. So that associated regions in adjacent rows come to be situated above one another even after repositioning, it may be necessary in this context for blocks containing associated groups to be interchanged with one another within their row.

A particularly large area gain is also obtained in this case if essentially all the transistor rows in the circuit configuration which contain transistors of the first conductivity type are split into two adjacent blocks such that the first block comprises only transistor groups whose associated transistor groups are arranged in the transistor row which comes next in the direction of arrangement, and the second block comprises only transistor groups whose associated transistor groups are arranged in the transistor row which comes previously in the direction of arrangement.

In particular, it is possible, even up to edge rows, for essentially all the transistor rows to be split into two adjacent blocks such that the first block comprises only transistor groups whose associated transistor groups are arranged in the transistor row which comes next in the direction of arrangement, and the second block comprises only transistor groups whose associated transistor groups are arranged in the transistor row which comes previously in the direction of arrangement.

In preferred embodiments of the circuit configuration, the transistors of different conductivity types are formed by N-channel transistors and P-channel transistors.

It is particularly expedient if the digital functional unit formed-from the group of transistors of the first conductivity type and the group of transistors of the second conductivity type is selected from the group comprising inverter, NAND gate, NOR gate, counter, half-adder, OR gate and driver. In this regard, it is clear to the person skilled in the art that, depending on application, other suitable functional units can be added to this list.

Other advantageous refinements, features and details of the invention can be found in the dependent claims, in the description of the exemplary embodiments and in the drawings. The invention will be explained in more detail below with reference to exemplary embodiments in conjunction with the drawings. Only the elements which are fundamental to understanding the invention are shown in the drawings.

Other features which are considered as characteristic for the invention are set forth in the appended claims.

Although the invention is illustrated and described herein as embodied in a circuit configuration having a plurality of transistors of two different conductivity types, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 shows a schematic illustration of a circuit configuration in accordance with another exemplary embodiment of the invention.

DESCRIPTION OF THE PREFERRED EMBODIMENTS

Figure 1:
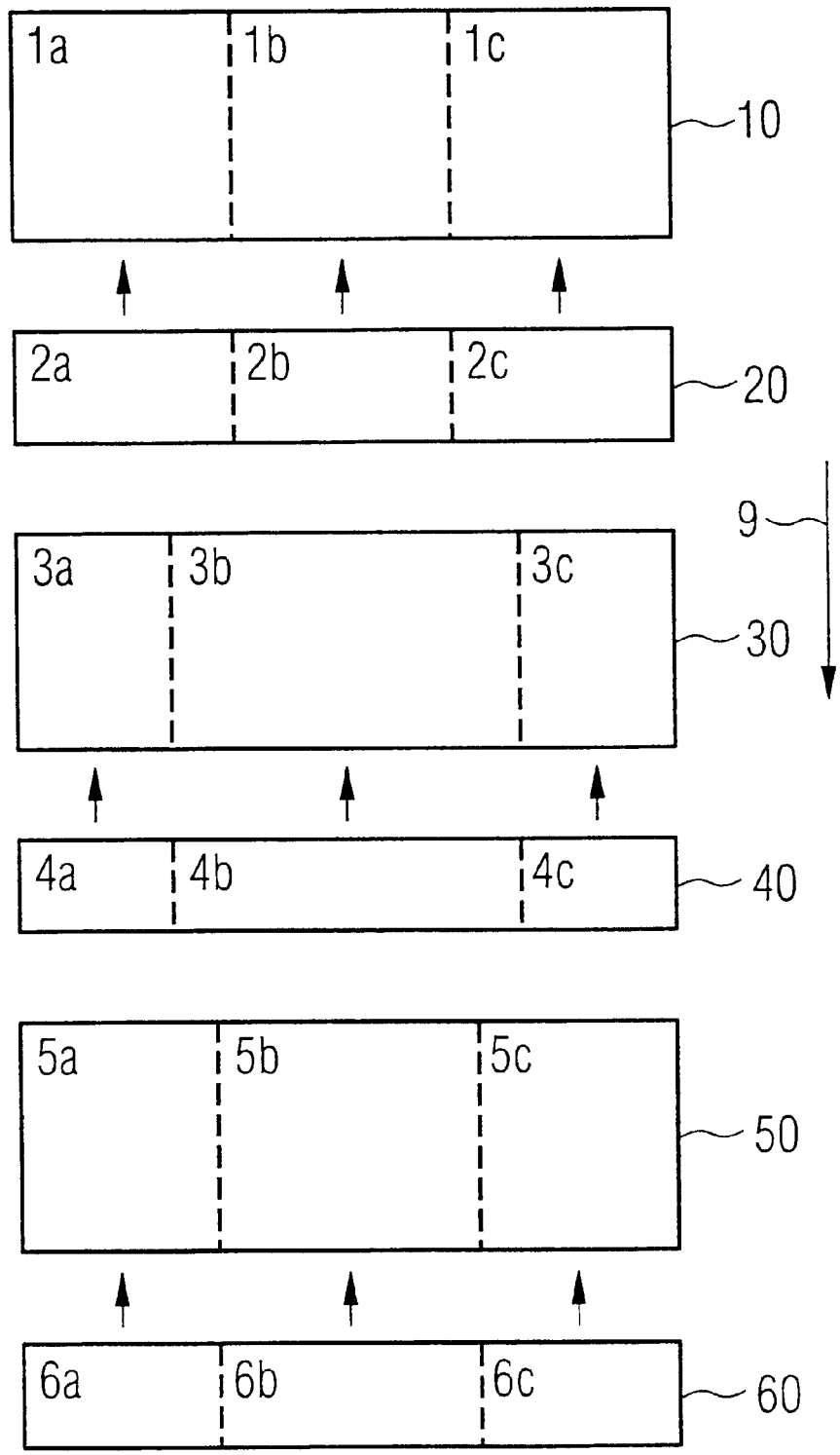
FIG. 1 shows a schematic illustration of a circuit configuration based on the prior art.

Referring now to the figures of the drawing in detail and first, particularly, to FIG. 1 thereof, there is shown a schematic illustration of a circuit configuration such as is obtained during automatic generation of a layout, for example using the layout synthesis program LAS. The rows 10, 30 and 50 are rows of P-channel transistors, and the rows 20, 40 and 60 are rows of N-channel transistors. The rows are arranged alternately in succession along the direction of arrangement 9. The invention is naturally not limited to the number of rows shown.

The P-channel rows and N-channel rows each contain groups of functionally affiliated transistors which are denoted by 1a–c, 2a–c, etc. in the illustration in FIG. 1. A respective group of P-channel transistors has an associated group of N-channel transistors in the next transistor row, as indicated by the vertical arrows between groups. The two mutually associated groups are connected to one another in the finished circuit and together form a digital functional element, for example a NAND gate.

For the purpose of illustration, FIG. 1 shows three respective mutually associated groups per pair of transistor rows, namely, for the rows 10 and 20, the groups 2a and 1a, 2b and 1b, and 2c and 1c. Accordingly, in the rows 30 and 40, the groups 4a and 3a, 4b and 3b, and 4c and 3c are associated with one another, and in the rows 50 and 60 the groups 6a, 5a, 6b, 5b and 6c, 5c.

The size and number of the transistors are generally different in the associated groups, which means that a large number of empty areas arise at least in the groups of transistors of one conductivity type in this form of layout. This is shown schematically in the imaginary intermediate step shown in FIG. 2. In the exemplary embodiment, the N-channel transistors require a lesser width than the associated P-channel transistors, and hence less area than they are allowed by the layout program on account of their association with corresponding groups of P-channel transistors.

Figure 2:
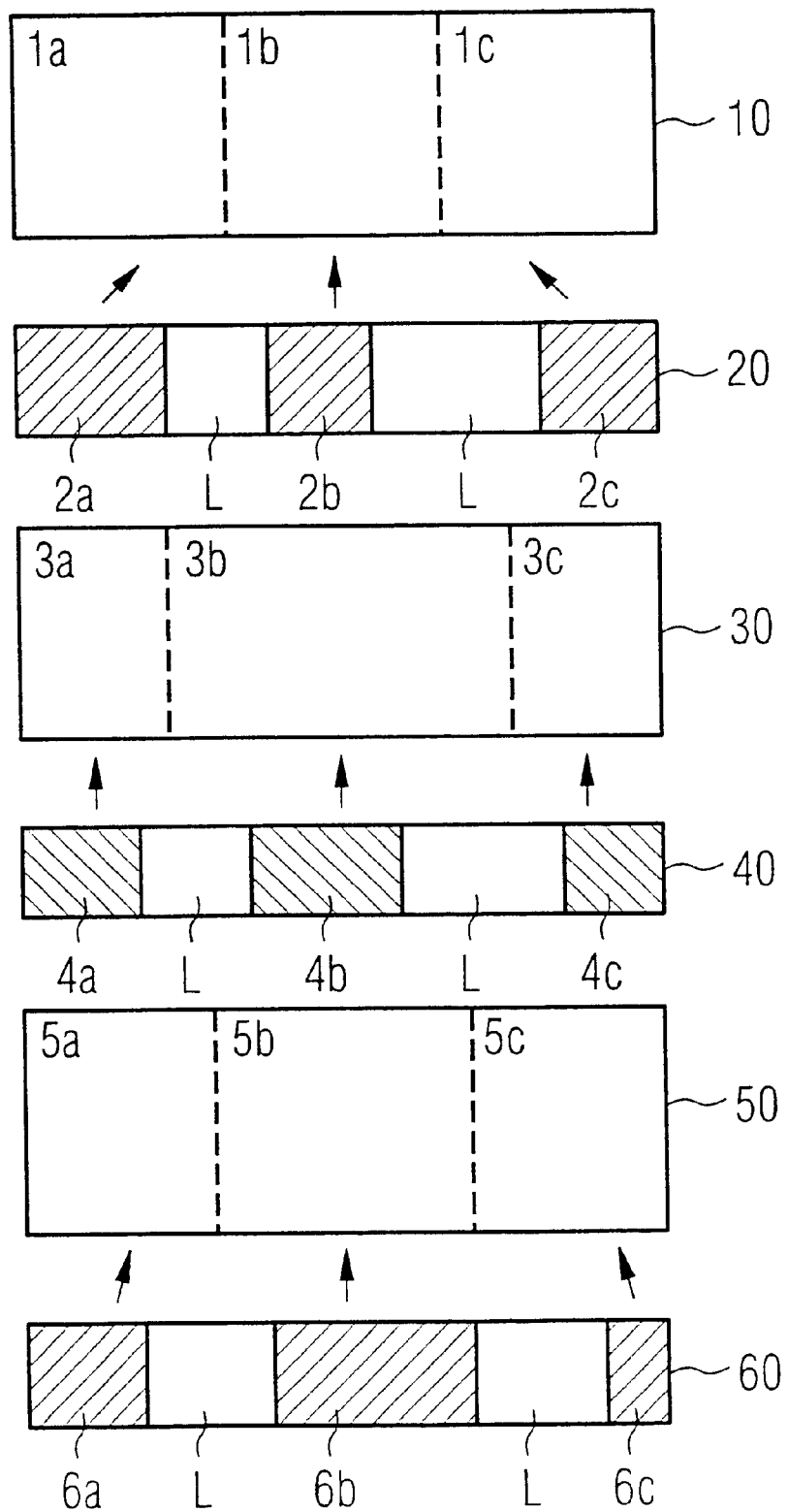
FIG. 2 shows an imaginary intermediate step to assist in understanding the circuit configuration shown in FIG. 3.
Figure 3:
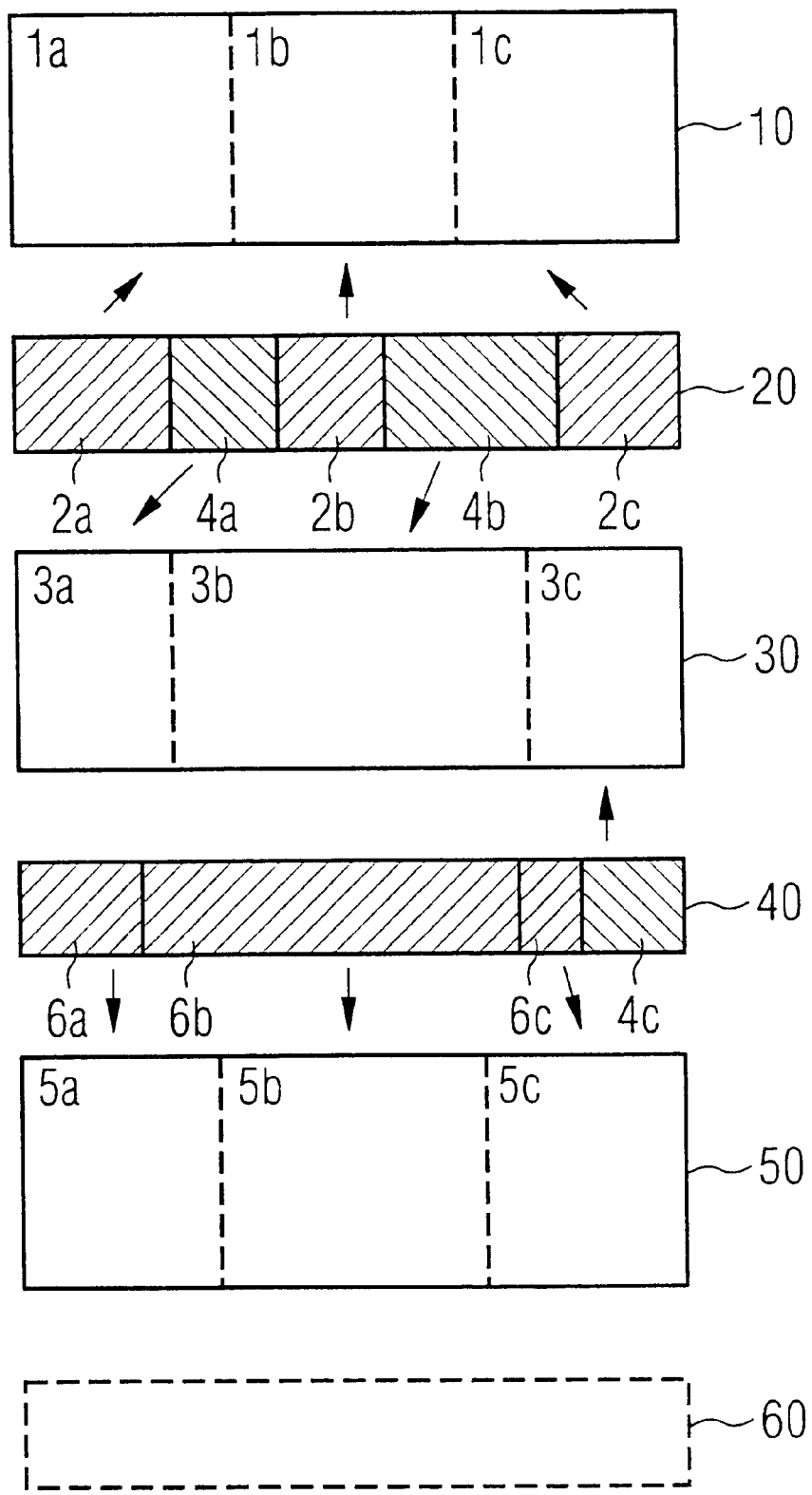
FIG. 3 shows a schematic illustration of a circuit configuration in accordance with an exemplary embodiment of the invention.

Whereas FIG. 1 shows the size of the groups 2a–c, 4a–c, 6a–c in line with the association, the illustration in FIG. 2 indicates the actual area requirement for each of these groups. The areas L between the groups are therefore available in principle for other use. This is utilized in the exemplary embodiment of the invention shown in FIG. 3 by virtue of the row 20 containing not only the groups 2a–c having associated groups from the row 10, but also the groups 4a and 4b having associated groups from row 30. In the conventional arrangement shown in FIG. 1, the association of these groups 4a and 4b with the groups from row 30 meant they were situated in the next row, namely row 40.

The repositioning of the groups 4a, 4b results in further available areas in row 40 as compared with the known configuration. In the exemplary embodiment, this location accommodates the three groups 6a–c, whose associated groups are situated in row 50. The row 60, which is still needed in the conventional layout in FIG. 1, can therefore be dispensed with in the inventive circuit configuration shown in FIG. 3, and the circuit's space requirement is significantly reduced.

At the same time, associated groups are arranged in adjacent rows in the inventive refinement as well, which means that affiliated N-channel and P-channel transistors can continue to be situated above one another and thus permit the shortest possible wiring lengths.

Figure 4:
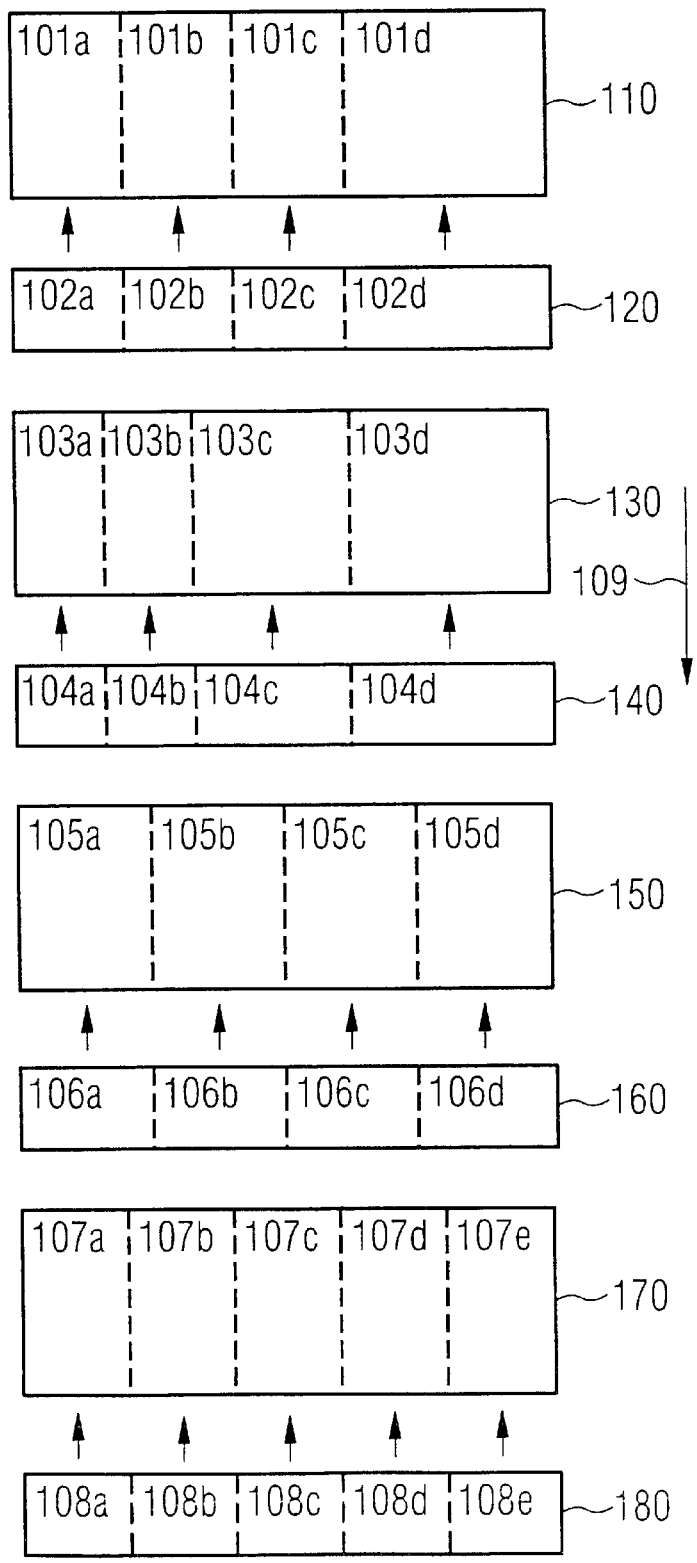
FIG. 4 shows a schematic illustration of another circuit configuration based on the prior art.

Another exemplary embodiment of the invention is described in connection with FIGS. 4 to 6. FIG. 4, like FIG. 1, shows a schematic illustration of a circuit configuration as the result of automatic layout generation. In this layout, P-channel transistors are arranged in the rows 110, 130, 150 and 170, and N-channel transistors are arranged in the rows 120, 140, 160 and 180 alternately along the direction of arrangement 109.

The individual transistor groups are denoted by reference symbols 101a–d to 108a–e, with, as in FIG. 1, a respective group of P-channel transistors having an associated group of N-channel transistors in the next transistor row.

Thus, in the circuit configuration shown in FIG. 4, the groups 104a and 103a, 104b and 103b, 104c and 103c, and 104d and 103d from the rows 130 and 140, for example, are associated with one another and are connected to one another in the finished circuit such that they form a digital functional unit.

Figure 5:
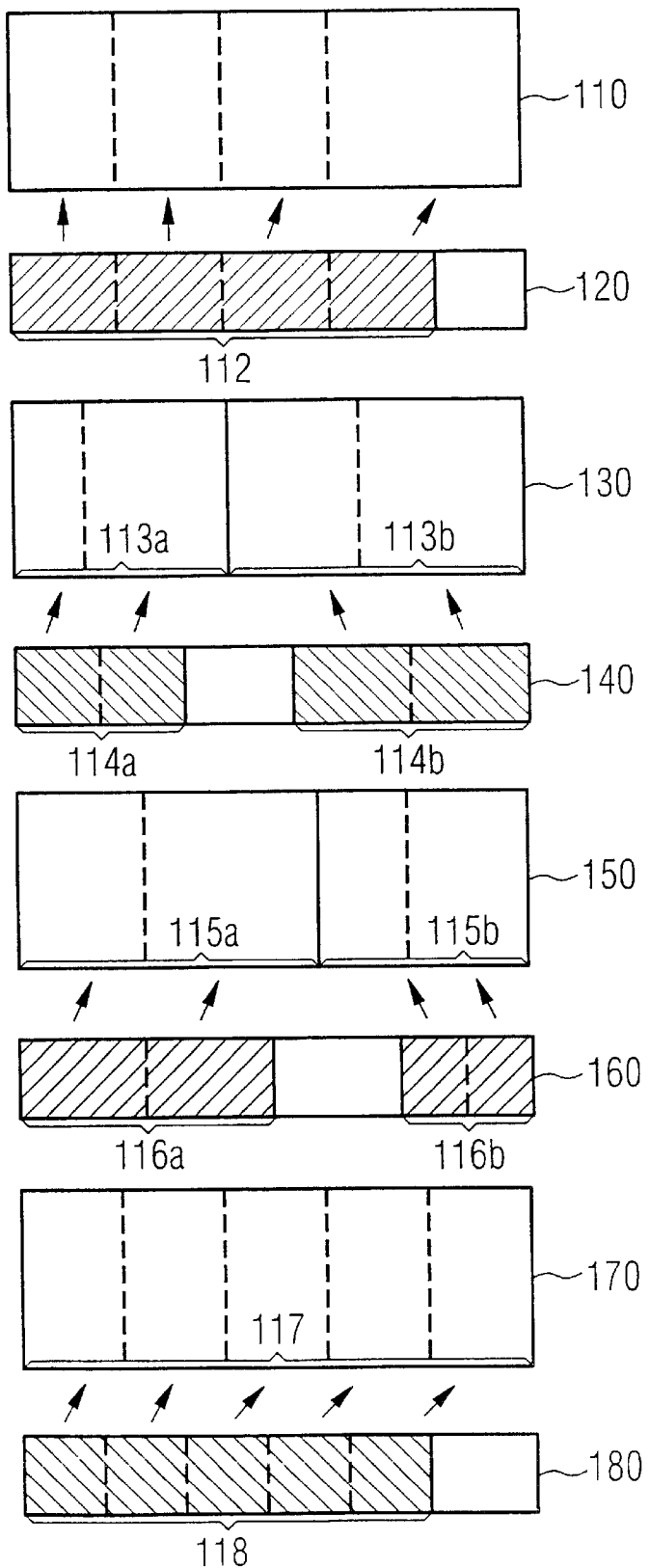
FIG. 5 shows an imaginary intermediate step to assist in understanding the circuit configuration shown in FIG. 6.

In this exemplary embodiment too, the different size and number result in empty areas in the N-channel regions, as indicated in FIG. 5. The illustration in FIG. 6 then shows the arrangement of the transistor groups in accordance with the invention. It is understood best when FIGS. 5 and 6 are considered at the same time.

The N-channel groups 102a–d form a block 112 which is situated entirely in row 120 but does not fill it completely when the transistors have been pushed together. The free area can be taken up by a block 114a containing N-channel groups 104a, 104b, whose associated groups 103a, 103b are situated in row 130.

The repositioning of the block 114a as compared with the conventional arrangement shown in FIG. 4 results in the groups 103a, 103b which form the block 113a simultaneously being shifted from the left-hand side to the right-hand side of the row 130 in order to permit the shortest possible connections between the respectively associated groups.

The remaining P-channel block 113b and the associated N-channel block 114b have been shifted to the left-hand side of their respective row in FIG. 6. The repositioning of block 114a in the row 120 and the pushing together of the transistors in the block 114b result in a further area which can be put to other use in row 140.

Similarly to the the procedure above, this area is filled by the block 116a, which contains groups 106a, 106b which each have associated groups in row 150. These form the block 115a, which, like the block 113a, has been shifted to the right-hand side of the row 150.

Row 160 still contains the groups 116c, 116d, forming the block 116b, having the associated P-channel block 115b, which has been shifted to the left as compared with the conventional arrangement.

Row 160 now provides space not only for the block 116b but also for the entire pushed-together block 118. Block 118 contains the five groups 118a–e, which each have associated groups 117a–e situated in row 170. This makes the row 180 superfluous as compared with the arrangement based on the prior art and reduces the area requirement of the circuit configuration.

The procedure outlined is naturally not limited to N-channel and P-channel transistors but can be applied generally to comparable regions. The roles of N-channel and P-channel transistors can also be switched. In particular, free areas can arise not only in the N-channel regions, as in the illustration above, but also in the P-channel regions.

I claim:

1. A circuit configuration, comprising:

a plurality of transistors of a first and a second conductivity type disposed in transistor rows, said transistor rows being formed with a spacing distance from one another, disposed in succession along a given direction, and alternately containing only transistors of a respective one of said conductivity types;

said transistors in each transistor row forming groups such that a respective group of transistors of said first conductivity type has an associated group of transistors of said second conductivity type in an adjacent transistor row, said associated group of transistors forming a digital functional unit with the respective group in the adjacent said transistor row;

wherein a first transistor row, a second transistor row, and a third transistor row each contain both a transistor group whose associated transistor group is arranged in the transistor row that is adjacent in said given direction and a transistor group whose associated transistor group is arranged in the transistor row that is adjacent in a direction opposite said given direction;

wherein said second transistor row is arranged in said given direction between said first transistor row and said third transistor row and contains a transistor group that is associated with a transistor group in said first transistor row, and a transistor group that is associated with a transistor group in said third transistor row; and wherein said first transistor row, said second transistor row, and said third transistor row are split into two adjacent blocks such that a first block comprises only transistor groups whose associated transistor groups are arranged in the transistor row adjacent in said given direction, and a second block comprises only transistor groups whose associated transistor groups are arranged in the transistor row adjacent in the direction opposite said given direction.

2. The circuit configuration according to claim 1, wherein said digital functional units formed by said transistor groups form elements of a logic or digital circuit.

3. The circuit configuration according to claim 1, wherein said transistor rows that contain transistors of said first conductivity type contain a transistor group whose associated transistor group is arranged in said transistor row that comes next in said given direction and a transistor group whose associated transistor group is arranged in a transistor row adjacent in the direction opposite said given direction.

4. The circuit configuration according to claim 1, wherein said transistor rows that contain transistors of said second conductivity type contain a transistor group whose associated transistor group is arranged in the transistor row that comes next in said given direction and a transistor group whose associated transistor group is arranged in a transistor row adjacent in the direction opposite said given direction.

5. The circuit configuration according claim 1, wherein said second transistor row is split into two adjacent blocks including a first block comprising only transistor groups whose associated transistor groups are arranged in the transistor row that is adjacent in said given direction, and a second block comprising only transistor groups whose associated transistor groups are arranged in a transistor row adjacent in the direction opposite said given direction.

6. The circuit configuration according to claim 5, wherein those transistor rows that contain transistors of said first conductivity type are split into two adjacent blocks such that a first block comprises only transistor groups whose associated transistor groups are arranged in the transistor row that is adjacent in said given direction, and a second block comprises only transistor groups whose associated transistor groups are arranged in the transistor row adjacent in the direction opposite said given.

7. The circuit configuration according to claim 1, wherein said transistors are N-channel transistors and P-channel transistors.

8. The circuit configuration according to claim 1, wherein said digital functional unit formed from the group of transistors of said first conductivity type and the group of transistors of said second conductivity type is selected from the group consisting of an inverter, a NAND gate, a NOR gate, a counter, a half-adder, an OR gate, and a driver.

9. A circuit configuration, comprising:
a plurality of transistors of a first and a second conductivity type disposed in transistor rows, said transistor rows being formed with a spacing distance from one another, disposed in succession along a given direction, and alternately containing only transistors of a respective one of said conductivity types;
said transistors in each transistor row forming groups such that a respective group of transistors of said first conductivity type has an associated group of transistors of said second conductivity type in an adjacent transistor row, said associated group of transistors forming a digital functional unit with the respective group in the adjacent said transistor row;
wherein a first transistor row, a second transistor row, and a third transistor row each contain both a transistor group whose associated transistor group is arranged in the transistor row that is adjacent in said given direction and a transistor group whose associated transistor group is arranged in the transistor row that is adjacent in a direction opposite said given direction;
wherein said second transistor row is arranged in said given direction between said first transistor row and said third transistor row and contains a transistor group that is associated with a transistor group in said first transistor row, and a transistor group that is associated with a transistor group in said third transistor row; and
wherein a fourth transistor row is disposed in the direction opposite said given direction from said first transistor row, and a fifth transistor row is disposed on a side of said third transistor row in said given direction, said fourth transistor row and said fifth transistor row contain only associated transistor groups in said first transistor row and in said third transistor row, respectively.

10. The circuit configuration according to claim 9, wherein said digital functional units formed by said transistor groups form elements of a logic or digital circuit.

11. The circuit configuration according to claim 9, wherein said transistor rows that contain transistors of said first conductivity type contain a transistor group whose associated transistor group is arranged in said transistor row that comes next in said given direction and a transistor group whose associated transistor group is arranged in a transistor row adjacent in the direction opposite said given direction.

12. The circuit configuration according to claim 9, wherein said transistor rows that contain transistors of said second conductivity type contain a transistor group whose associated transistor group is arranged in the transistor row that comes next in said given direction and a transistor group whose associated transistor group is arranged in a transistor row adjacent in the direction opposite said given direction.

13. The circuit configuration according to claim 9, wherein said second transistor row is split into two adjacent blocks including a first block comprising only transistor groups whose associated transistor groups are arranged in the transistor row that is adjacent in said given direction, and a second block comprising only transistor groups whose associated transistor groups are arranged in a transistor row adjacent in the direction opposite said given direction.

14. The circuit configuration according to claim 13, wherein those transistor rows that contain transistors of said first conductivity type are split into two adjacent blocks such that a first block comprises only transistor groups whose associated transistor groups are arranged in the transistor row that is adjacent in said given direction, and a second block comprises only transistor groups whose associated transistor groups are arranged in the transistor row adjacent in the direction opposite said given direction.

15. The circuit configuration according to claim 9, wherein said transistors are N-channel transistors and P-channel transistors.

16. The circuit configuration according to claim 9, wherein said digital functional unit formed from the group of transistors of said first conductivity type and the group of transistors of said second conductivity type is selected from the group consisting of an inverter, a NAND gate, a NOR gate, a counter, a half-adder, an OR gate, and a driver.

* * * * *